United States Patent [19]
Chi et al.

[11] Patent Number: 5,920,785
[45] Date of Patent: Jul. 6, 1999

[54] DRAM CELL AND ARRAY TO STORE TWO-BIT DATA HAVING MERGED STACK CAPACITOR AND TRENCH CAPACITOR

[75] Inventors: Min-Hwa Chi; George Meng-Jaw Cherng, both of Hsinchu, Taiwan

[73] Assignee: Vanguard International Semiconductor Corporation, Hsin-Chu, Taiwan

[21] Appl. No.: 09/018,457

[22] Filed: Feb. 4, 1998

[51] Int. Cl.[6] .................................................. H01L 21/8242
[52] U.S. Cl. .......................... 438/387; 438/396; 257/306
[58] Field of Search ................................. 438/396, 397, 438/398, 387

[56] References Cited

U.S. PATENT DOCUMENTS

| | | | |
|---|---|---|---|
| 4,896,197 | 1/1990 | Mashiko | 357/23.6 |
| 5,057,887 | 10/1991 | Yashiro et al. | 257/305 |
| 5,066,608 | 11/1991 | Kim et al. | 437/52 |
| 5,146,425 | 9/1992 | Kang et al. | 365/149 |
| 5,217,918 | 6/1993 | Kim et al. | 437/52 |
| 5,234,854 | 8/1993 | An et al. | 437/47 |
| 5,293,055 | 3/1994 | Hara et al. | 257/301 |
| 5,329,146 | 7/1994 | Soeda | 257/301 |
| 5,357,132 | 10/1994 | Turner | 257/301 |
| 5,410,509 | 4/1995 | Morita | 365/210 |
| 5,455,192 | 10/1995 | Jean | 437/52 |
| 5,606,189 | 2/1997 | Adan | 257/306 |
| 5,665,624 | 9/1997 | Hong | 438/244 |

OTHER PUBLICATIONS

"The Evolution of DRAM Cell Technology", El–Kareh et al, Solid State Technology, May, 1997, pp. 89–101.

*Primary Examiner*—Olik Chaudhuri
*Assistant Examiner*—WilliamOlik David Coleman
*Attorney, Agent, or Firm*—George O. Saile; Stephen B. Ackerman; Billy Knowles

[57] ABSTRACT

A twin bit DRAM cell capable of storing two bits of digital data as stored charge within the DRAM cell is disclosed. The twin bit DRAM cell has two pass transistors, a trench capacitor, and a stack capacitor. The pass transistors each have a source connected to a bit line voltage generator to control placement of the charge within the twin bit DRAM cell, a gate connected to a word line voltage generator to control activation of the DRAM cells, and a drain. The trench capacitor has a top plate connected to the drain of the first pass transistor and a bottom plate connected to a first biasing voltage source. The stack capacitor has a first plate connected to the drain of the second pass transistor and a second plate connected to a second biasing voltage generator. Twin bit DRAM cells will be arranged in a plurality of rows and columns to form an array of twin bit DRAM cells.

8 Claims, 8 Drawing Sheets

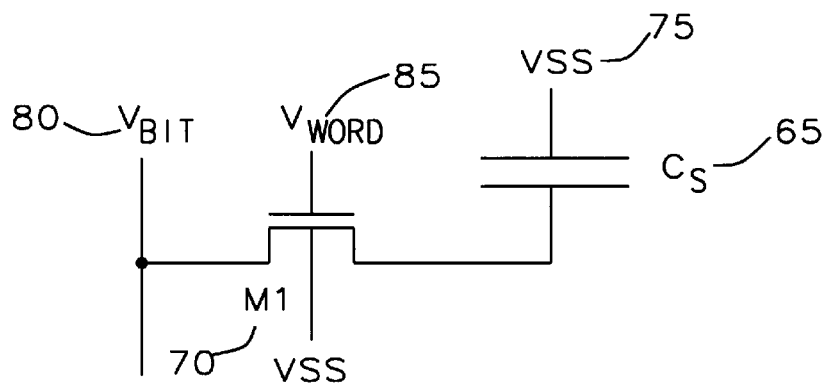
FIG. 1a – Prior Art
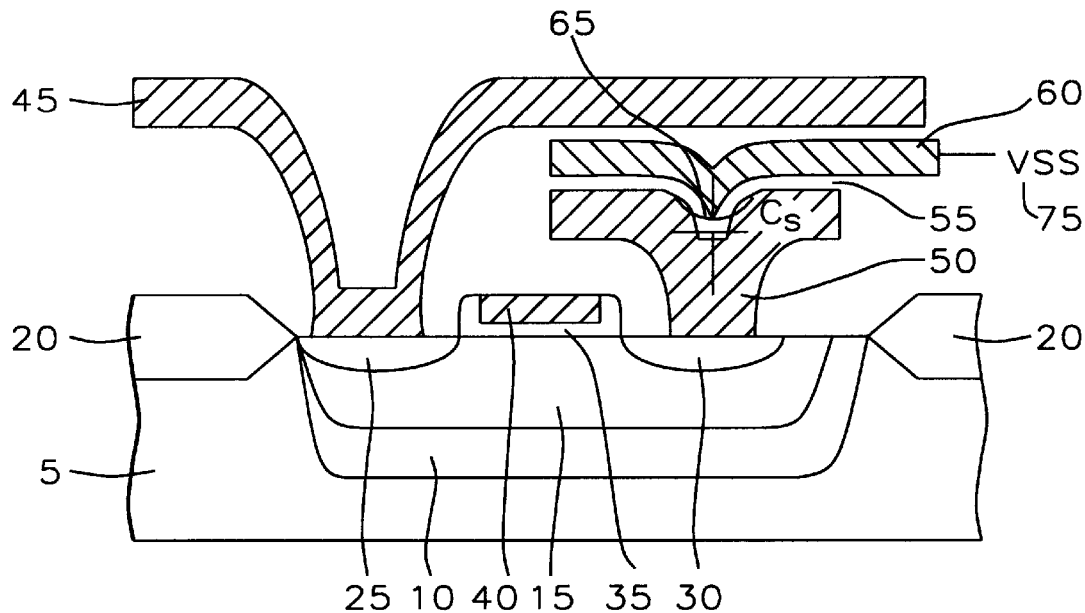
FIG. 1b – Prior Art
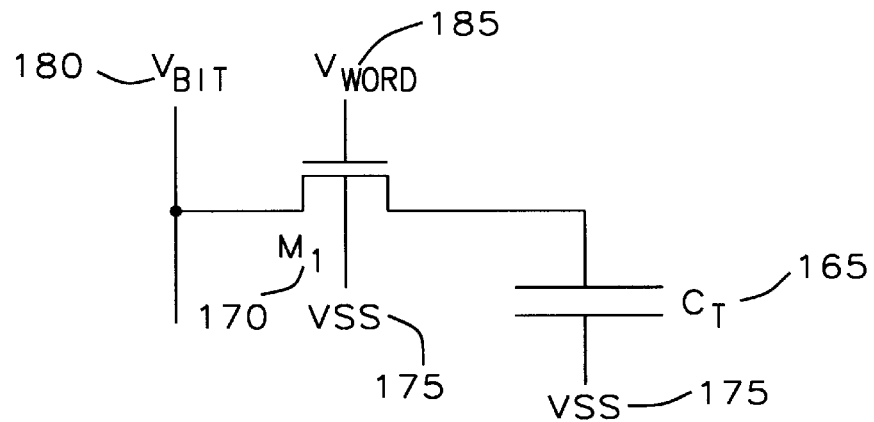
FIG. 1c – Prior Art

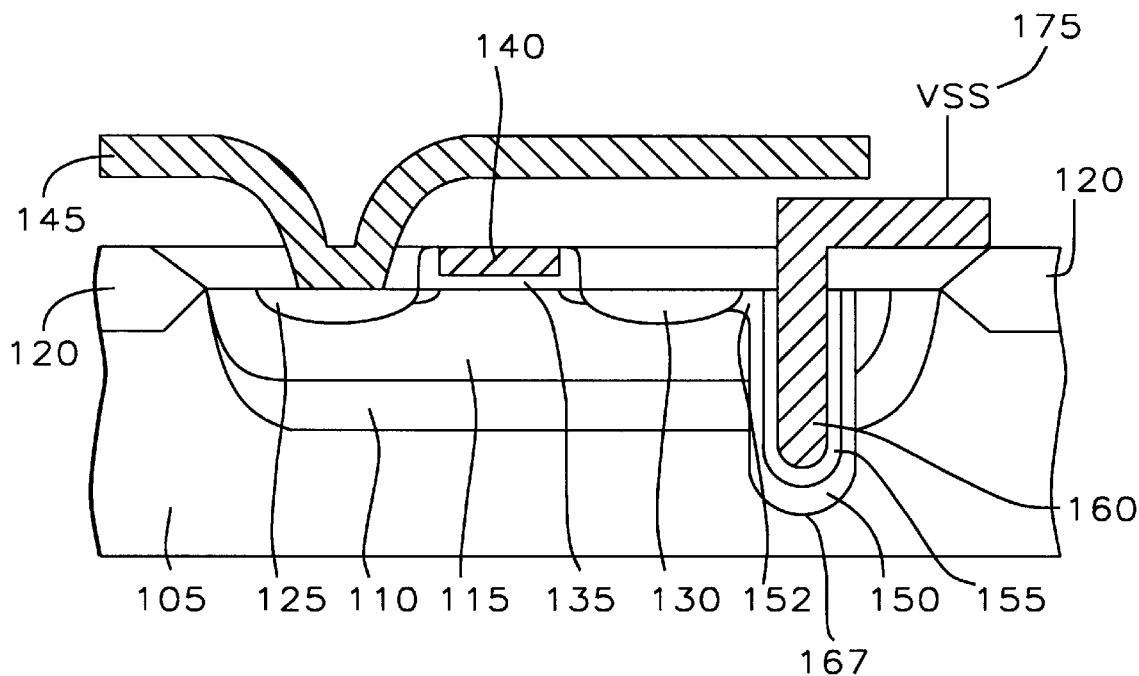
FIG. 1d - Prior Art
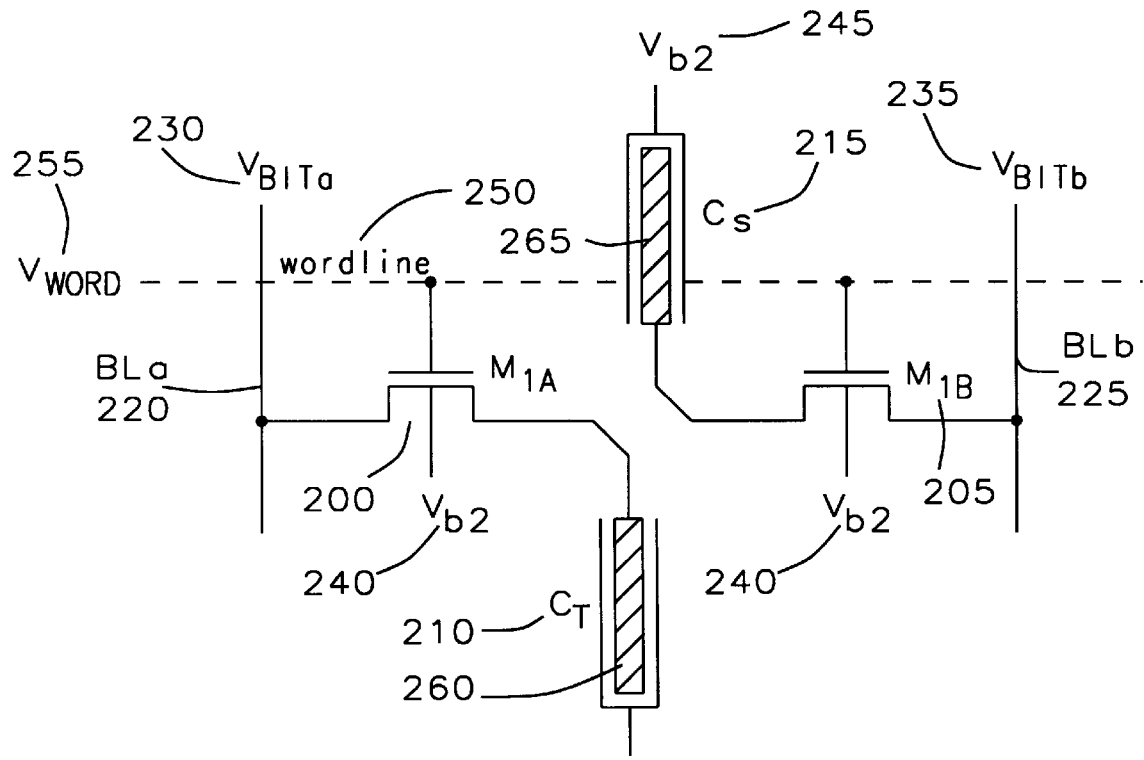
FIG. 2a

DRAM CELL AND ARRAY TO STORE TWO-BIT DATA HAVING MERGED STACK CAPACITOR AND TRENCH CAPACITOR

BACKGROUND OF THE INVENTION

1. Field of the Invention

This invention relates to the dynamic random access memories (DRAM) and more particularly to the structures and methods of fabrication of DRAM's storing multiple data bits per DRAM cell.

2. Description of Related Art

The fabrication and structure of DRAM cells and DRAM arrays are well known in the art. Typical cell structures for high density DRAM in prior art is composed of one transistor $M_1$ 70 for switching charges and one storage capacitor C 65 for storing charges is illustrated in FIGS. 1a and 1c. The transistor $M_1$ 70 will be an n-MOS transistor fabricated as shown in FIGS. 1b and 1c. A deep N-well 10 will be formed in a p-type substrate 5. The area for DRAM cells will be formed as openings during the formation of insulation. The insulation is formed by the local oxidation of the silicon substrate (LOCOS) 20. Within the deep n-well 10 a shallower p-well 15 will be formed. The gate 40 of the n-MOS transistor $M_1$ 70 will be formed as a conductive material such as polysilicon placed over an insulating gate oxide 35 to define the channel area that will be between the drain 30 and source 25 of the n-MOS transistor $M_1$ 70.

The drain 30 and the source 25 will be formed by masking the semiconductor substrate 5 and implanting an $N^+$ material to form the $N^+$ drain 30 and the $N^+$ source 25. The gate 40 of the MOS transistor $M_1$ 70 will be connected to the word line control circuitry (not shown).

The capacitor C 25 is formed by placing a conductive metal connected to the substrate biasing voltage source $V_{ss}$ on a dielectric placed over the $N^+$ drain of the transistor $M_1$ 70. The capacitor C 25 as shown is diagrammatic. The particular structure of the capacitor C 25 is well known and shown in "The Evolution Of DRAM Cell Technology" by B. El-Kareh et al., Solid State Technology, May 1997, pp. 89–101. In order to maintain the minimum storage capacitance of 30–40 fF of a cell, the structure of the DRAM cell results in complex semiconductor processing to develop these structures.

Refer now to FIGS. 1c and 1d, The trench capacitor $C_T$ 165 is formed by etching a deep trench 167 in the surface of the semiconductor substrate 105. An $N^+$ material is implanted in the surface of the trench 167 and to the $N^+$ drain 130 to form an $N^+$ strap 152. An insulating material such as oxidized silicon nitride ONO, silicon dioxide, or silicon nitride will then be deposited on the surface of the trench 167 to form the capacitor dielectric 155. A conductive material such as polysilicon will be deposited in the trench 167 to fill the trench 167. The polysilicon "plug" 160 will then be attached to the substrate biasing voltage source $V_{ss}$ 175 to form a bottom plate of the capacitor $C_T$ 165. The top plate of the capacitor $C_T$ 165 will be the $N^+$ diffusion 150 that is connected by the $N^+$ strap 152 to the $N^+$ drain 130 of the MOS transistor $M_1$ 170. Again FIG. 1d is diagrammatic. The particular structure is well known in the art and illustrated in B. El-Kareh et al.

The deep n-well 110 is typically biased to the power supply voltage source $V_{cc}$ (i.e. the highest potential on chip) and the p-well is biased to substrate biasing voltage source $V_{ss}$ 175 (i.e. the lowest voltage on chip). The substrate biasing voltage source $V_{ss}$ 175 may be biased below ground (i.e. negative potential) so that the leakage current through the pass transistor is reduced. The presence of charge in the storage capacitor C 165 indicates a logical "1" and its absence of charge indicates a logical "0". The storage capacitor C 165 is connected to $N^+$ drain 130 of the transistor $M_1$ 170, and the other $N^+$ source 125 of the transistor M1 170 is connected to bit-line $V_{bit}$ 180 that controls the reading and writing of the DRAM cell. The gate 140 of the MOS transistor $M_1$ 170 is connected to the word line $V_{word}$ 185 to control the selection of the DRAM cell.

U.S. Pat. No. 4,896,197 (Mashiko) describes a DRAM cell incorporating a trench capacitor to store one bit and a stack capacitor to store a second bit. A first pass transistor controls the charge of the trench capacitor, while a second pass transistor controls the charge of the stacked capacitor. The trench capacitor and the stack capacitor have a common L shaped plate between them. The L shaped common plate would be coupled to the substrate biasing voltage source $V_{ss}$ of FIGS. 1a and 1c.

U.S. Pat. No. 5,066,608 (Kim et al.) describes a method for manufacture of a stacked-trench capacitor. The stacked-trench capacitor will incorporate both a trench capacitor and stack capacitor to increase the capacitance of the DRAM cell.

U.S. Pat. No. 5,217,918 (Kim et al.) discloses an integrated semiconductor memory device incorporating stacked capacitors and combined stack-trench capacitors to form column and rows of memory cells. The stacked capacitors and the stack-trench capacitors are alternated to allow improved density, while preventing leakage current and soft errors. Again the stack capacitor and the stack-trench capacitor have a common plate that would be connected to the substrate biasing voltage source $V_{ss}$ of FIGS. 1a and 1c.

U.S. Pat. No. 5,234,854 (An et al.) describes a method for manufacturing a stack-trench capacitor.

U.S. Pat. No. 5,410,509 (Morita) discloses a DRAM array employing a combination of stacked capacitor memory cells and trench capacitor memory cells to form the array. The stacked capacitor memory cells will occupy on column of the array while the trench capacitor memory cells will occupy alternate columns of the memory array. The memory array will also have the stacked capacitor cells and the trench capacitor memory cells used as dummy memory cells within the array. The structure of the memory array is such that when the stacked capacitor memory cells are selected, the dummy stacked memory cells are selected and like wises for the trench capacitor memory cells and the dummy trench capacitor memory cells.

U.S. Pat. No. 5,455,192 (Jeon) describes a method of fabricating a DRAM cell incorporating stacked capacitors and trench capacitors. The structure of the stacked capacitors and the trench capacitors is such that the stacked capacitors and the trench capacitors are connected in parallel to increase the capacitance of the DRAM cell.

SUMMARY OF THE INVENTION

An object of this invention is to provide a DRAM cell capable of storing two bits of digital data as discrete levels of stored charge within the DRAM cell.

Another object of this invention is to provide a DRAM cell incorporating a stacked capacitor and a trench capacitor to retain the discrete levels of charge representing the two bits of digital data.

Further another object of this invention is to provide an array of DRAM cells, each DRAM cell capable of storing two bits of digital data.

Still further another object of this invention is to provide a method of fabrication of a DRAM cell capable of storing two bits of digital data.

To accomplish these and other objects, a twin bit DRAM cell has two pass transistors, a trench capacitor, and a stack capacitor. The first pass transistor has a source connected to a first bit line voltage generator, a gate connected to a word line voltage generator, and a drain. The trench capacitor is placed in close proximity of the first pass transistor and is formed within the semiconductor substrate. The trench capacitor includes a top plate connected to the drain of the first pass transistor, a bottom plate connected to a first biasing voltage source, and a first capacitor dielectric separating the top and bottom plates.

The second pass transistor has a source connected to a second bit line voltage generator, a gate connected to a word line voltage generator, and a drain. The stack capacitor is formed above the trench capacitor on the semiconductor substrate. The stack capacitor has a first plate connected to the drain of the second pass transistor, a second plate connected to a second biasing voltage source, and a second capacitor dielectric separating the first and second plates. An insulating layer isolates the stack capacitor from the trench capacitor.

The twin bit DRAM cell will be formed into an integrated circuit memory. The integrated circuit memory will have a plurality of twin bit DRAM cells arranged in a plurality of rows and columns.

The integrated circuit memory will have a plurality of word lines such that each word line is located on each row of the twin bit DRAM cells and connected to the gates of the pass transistors on each row of the twin bit DRAM cells. Further, the integrated circuit memory will have a plurality of bit lines. A pair of bit lines is located at the boundary of each column of twin bit DRAM cells. One bit line is connected to the source of the first pass transistor of each twin bit DRAM cell on each column of twin bit DRAM cells and the other bit line of the pair of bit lines is connected to the source of the second pass transistor of each twin bit DRAM cell on each column of twin bit DRAM cells.

There is a plurality of word line control circuits coupled to each word line to select all the twin bit DRAM cells of one row of twin bit DRAM cells, and a plurality of bit line control circuits connected to one bit line to establish a necessary bit line voltage level during a writing and reading of the twin bit DRAM cells on a column of twin bit DRAM cells.

The integrated circuit memory will have a plurality of sense amplifiers such that each sense amplifier is connected to one bit line to sense a level of charge representing the two bits of digital data retained within the twin bit DRAM cell. A peripheral control circuit will provide control signals for the plurality of word line control circuits, bit line control circuits, twin bit sense amplifiers, and coupling-gate control circuits.

BRIEF DESCRIPTION OF THE DRAWINGS

FIGS. 1a and 1b show a schematic diagram and a cross sectional view of a stack capacitor DRAM cell of the prior art.

FIGS. 1c and 1d show a schematic diagram and a cross sectional view of a trench capacitor DRAM cell of the prior art.

FIGS. 2a and 2b show schematic diagrams of a twin bit DRAM cell of this invention.

DETAILED DESCRIPTION OF THE INVENTION

Figure 2B:
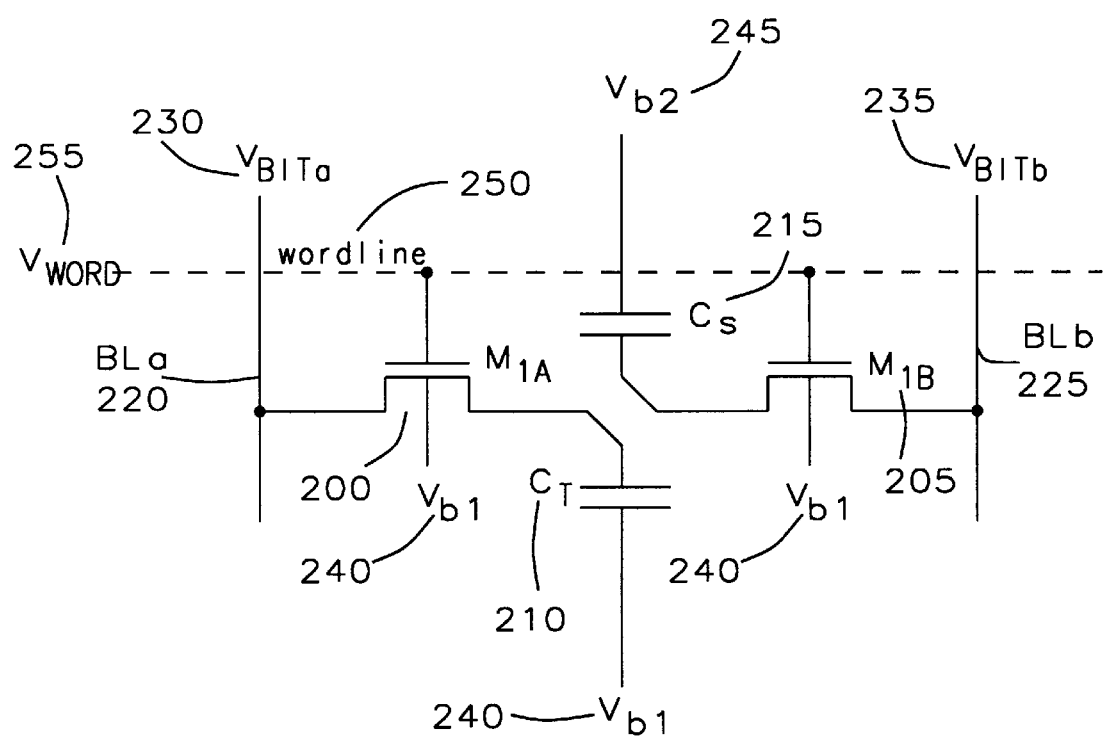

Refer now to FIGS. 2a and 2b to understand the structure of the twin bit DRAM cell of this invention. The n-MOS transistor $M_{1a}$ 200 acts as a pass transistor to control the transfer the digital data in the form of an electrical charge from the bit line BLa 220 to the top plate of the trench capacitor $C_T$ 210. The bulk of the transistor $M_{1A}$ 200 and the bottom plate of the trench capacitor 210 will be connected to a first biasing voltage source $V_{b1}$ 240.

The n-MOS transistor $M_{1b}$ 205 will act as a pass transistor to control the transfer of digital data in the form of electrical charge to the first plate of the stack capacitor $C_s$ 215. The second plate of the stack capacitor $C_s$ 215 will be connected to the second biasing voltage source $V_{b2}$ 245. The bulk of the n-MOS transistor $M_{1b}$ 205 will be connected to the first biasing voltage source $V_{b1}$ 240.

The gates of the n-MOS transistors $M_{1a}$ 200 and $M_{1b}$ 205 will be connected the word line 250. To activate the pass transistors $M_{1a}$ 200 and $M_{1b}$ 205, the word line voltage generator $V_{word}$ 255 will be set to a boosted voltage level $V_h$, that exceeds the level of the power supply voltage source ($V_{cc}$) by at least the threshold voltage level ($V_T$) of the pass transistors $M_{1a}$ 200 and $M_{1b}$ 205.

To write digital data to the trench capacitor $C_t$ 210 and the stack capacitor $C_s$ 215, the bit line voltage generators $V_{BITA}$ 230 and $V_{BITB}$ 235 will be respectively placed at a voltage level approaching the ground reference voltage potential (0V) to represent a first logic level (0), or a voltage level approaching the power supply voltage source ($V_{cc}$) to represent a second logic level (1).

The trench capacitor $C_t$ 210 and the stack capacitor $C_s$ 215 may not have exactly the same in magnitude of capacitance due to process variations, such as dielectric thickness, trench opening or depth. Therefore, if the bit line voltage generators $V_{BITA}$ 230 and $V_{BITB}$ 235 are placed at equal voltage levels (either the first logic level (0) or the second logic level (1)) during write operation, the amount of charge stored in either trench capacitor $C_t$ 210 and the stack capacitor $C_s$ 215 is not the same. This inequality of the stored signal charge causes problems of with the speed of the detecting or sensing the charge. The capacitor (trench capacitor $C_t$ 210 and the stack capacitor $C_s$ 215) with the lessor charge, will have its charge sensed slower. With first biasing voltage source $V_{b1}$ 240 and the second biasing voltage source $V_{b2}$ 245 separately biased on capacitor plates, the charge storage in each cell can be force to the same level. That is by setting the charge of the second logic level (1) in the stack capacitor $C_s$ 215 to the value of $(V_{cc}-V_{b2}).C_s$ equal to the charge for the second logic level (1) in trench capacitor $C_t$ 210. The level of the charge of the trench capacitor $C_t$ 210 will be $(V_{cc}-V_{b1}) C_T$. The relationship of the voltage levels of the first biasing voltage source $V_{b1}$ 240 and the second biasing voltage source $V_{b2}$ 245 will be:

$$V_{b2}=V_{b1}(C_T/C_S)+V_{cc}(1-C_T/C_s).$$

It will be obvious that if capacitance of the trench capacitor $C_t$ 210 is equal to the capacitance of the stack capacitor $C_s$ 215, then the first biasing voltage source $V_{b1}$ 240 and the second biasing voltage source $V_{b2}$ 245 will be equal.

In order to adjust the charge level for the second logic level (1) of the second logic level (1)) during write operation, the amount of charge stored in either trench capacitor $C_t$ 210 and the stack capacitor $C_s$ 215. The level of the first biasing voltage source $V_{b1}$ 240 and the second biasing voltage source $V_{b2}$ 245 will be set to 0V. The time for sensing or detecting the charge stored in the trench capacitor $C_t$ 210 and the stack capacitor $C_s$ 215 will be experimentally determined. If the times are significantly are systematically different, (e.g. trench capacitor $C_t$ 210 is always larger than the stack capacitor $C_s$ 215), then the charge stored on the stack capacitor $C_s$ 215 will be systematically detected slower than that of the charge stored on the trench capacitor $C_t$ 210. By gradually reducing the second biasing voltage source $V_{b2}$ 245 (toward negative) until the charge stored on the stack capacitor $C_s$ 215 is sensed as fast as the charge stored on the trench capacitor $C_t$ 210. The second biasing voltage source $V_{b2}$ 245 can be thus experimentally adjusted.

To read the digital data from the trench capacitor $C_T$ 210 and the stack capacitor $C_s$ 215, the bit line voltage generators $V_{BITA}$ 230 and $V_{BITB}$ 235 will precharge the bit lines $BL_a$ 220 and $BL_b$ 225 to a voltage level that is one half the level of the power supply voltage source ($V_{cc}/2$). Sense amplifiers (not shown) connected to each of the bit lines $BL_a$ 220 and $BL_b$ 225 will sense the presence or absence of charge respectively on the trench capacitor $C_T$ 210 and the stack capacitor $C_s$ 215 and interpret the contents of the twin bit DRAM cell as two bits of digital data (either the first logic level (0) or the second logic level (1)). That is the combinations of the digital data bits will be either both bits will be the first logic level (0), both bits will be the second logic level (1), the first bit Will be the first logic level (0) and the second bit will be the second logic level (1), or the first bit will be the second logic level (1) and the second bit will be the first logic level (0) for the four possible combinations of charge in the trench capacitor $C_T$ 210 and the stack capacitor $C_s$ 215.

The popular "latch-type" sense amplifier commonly used in DRAM is not suitable in an array of twin bit DRAM cells of this invention. The well-known differential sense amplifier, however, is very suitable and preferred in an array of twin bit DRAM cells of this invention. A typical differential sense amplifier has output that will be at the second logic level (1) if the input voltage $V_{in}$ is greater than the voltage level of a reference voltage source $V_{ref}$, and will be at the first logic level (0) if the input voltage $V_{in}$ is less than the voltage level of the reference voltage source $V_{ref}$. If a latch-type sense amplifier were to be used in an array of twin bit DRAM cells of this invention, the time required for the detection of the charge present on the in the trench capacitor $C_t$ 210 and the stack capacitor $C_s$ 215 would be very slow; the power would be large; and the sensitivity would be degraded significantly.

Each differential sense amplifier is connected to a bit-line $Bl1_a$ 220 and $Bl1_b$ 225 and a reference voltage source $V_{ref}$, which is biased to one half the power supply voltage source $V_{cc}/2$ at all times. After the word line voltage generator $V_{word}$ 255 is biased to the voltage level $Vh(>V_{cc}+V_T)$ and the pass transistors $M_{1a}$ 200 and $M_{1b}$ 205 have been activated, the potential of signals appears on bit-lines $Bl1_a$ 220 and $Bl1_b$ 225 and are amplified to either the second logic level (1) or the second logic level (0). Thus, the four levels of twin-bit data is represented by the voltage levels present at the output of the differential sense amplifiers. A more complete description of the operation of an array of twin bit DRAM cells of this invention is explained, hereinafter, in FIG. 4.

The trench capacitor $C_T$ 210 is shown diagrammatically as the top plate being a polysilicon plug poly1 260 in a trench that forms the bottom plate. Similarly, a polysilicon layer poly2 265 will form the first plate of the stack capacitor $C_s$ 215. The structure also demonstrates that the trench capacitor $C_T$ 210 and the stack capacitor $C_s$ 215 will be vertically aligned with one another.

Figure 3:
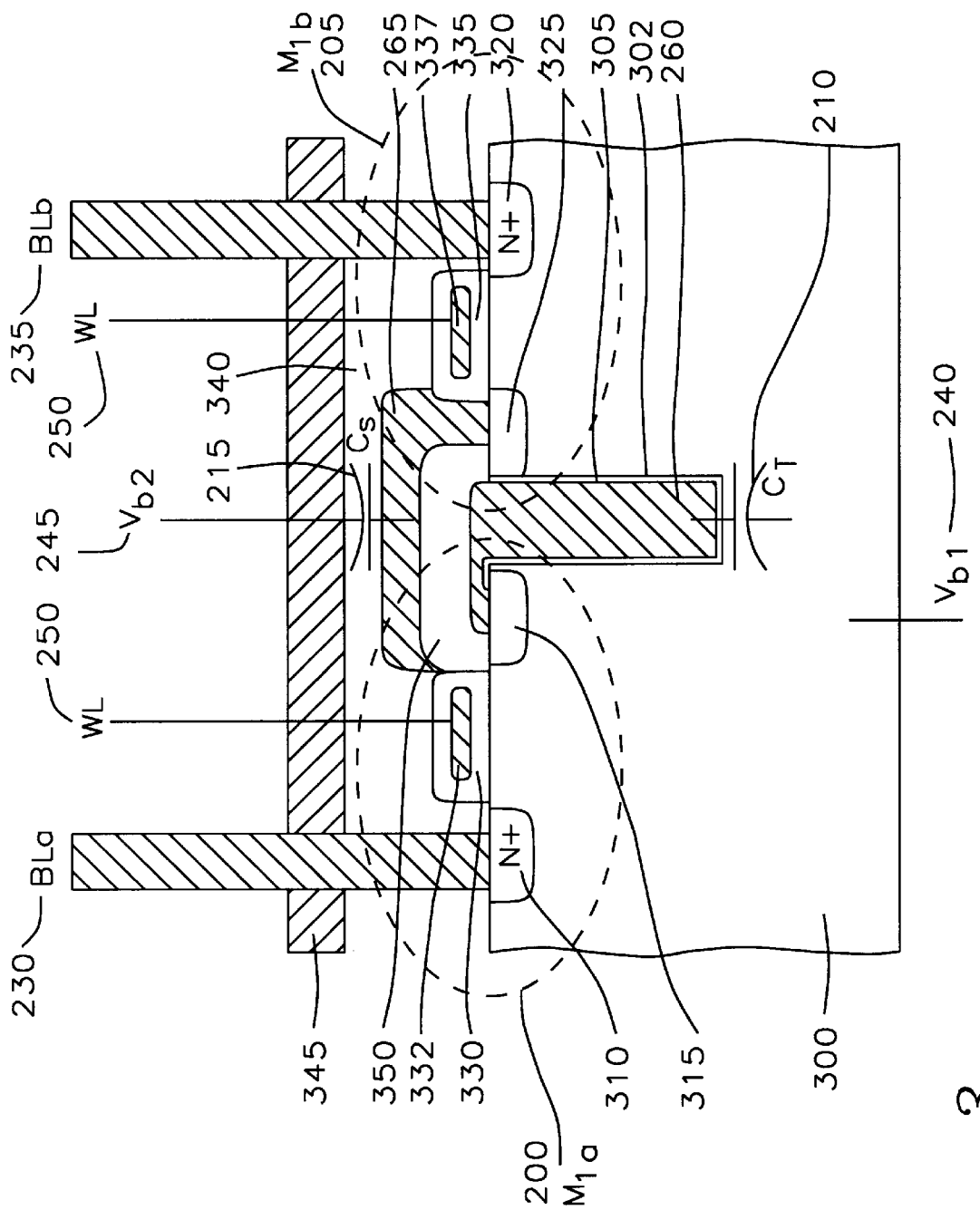
FIG. 3 shows a cross sectional view of a twin bit DRAM cell of this invention.

Referring now to FIG. 3. The trench capacitor $C_T$ 210 is formed by deep etching a trench 302 into a surface of the p-type semiconductor substrate 300. A capacitor dielectric ONO1 305 is deposited on the surface of the trench 302. The capacitor dielectric ONO1 305 will be formed of insulating materials such as silicon nitride, silicon dioxide, or oxidized silicon nitride (ONO). The trench will be then filled with a polysilicon plug poly1 260 to form the top plate of the trench capacitor $C_T$ 210. The bottom plate of the trench capacitor $C_T$ 210 is the p-type substrate 300.

The pass transistors $M_{1a}$ 200 and $M_{1b}$ 205 are formed by masking the surface of the p-type substrate and depositing and insulating material to form the gate oxide 330 and 335. On the surface of the gate oxide 330 and 335, a polysilicon layer is deposited and etched to form the gates 332 and 337 of the pass transistors $M_{1a}$ 200 and $M_{1b}$ 205. The surface of the p-type semiconductor substrate 300 will be masked and implanted with an n-type impurity to form the lightly doped drains NLDD 315 and 325. Insulating material will be deposited on the surface of the semiconductor substrate 300 adjacent to the gates 332 and 337 to form spacers for the lightly doped drains. The surface of the semiconductor substrate 300, again, will be masked and implanted with an n-type impurity to form the $N^+$ sources 310 and 320.

A second layer of polysilicon poly2 265 will be deposited to form the connection between the drain 315 of the first pass transistor $M_{1a}$ 200 and the top plate of the trench capacitor $C_T$ 210. Above the top plate of the trench capacitor $C_T$ 210, a capacitor insulating material 350 is deposited to electrically insulate the trench capacitor $C_T$ 210 and the stack capacitor $C_s$ 215.

The capacitor insulating material 350 has to be sufficiently thick to prevent interaction from between the trench capacitor $C_T$ 210 and the stack capacitor $C_s$ 215. The thickness of the capacitor insulating material 350 typically will be approximately 2000 Å. The trench capacitor $C_T$ 210 and the stack capacitor $C_s$ 215 will have capacitance values on the order of 50 fF. The stray capacitance between the trench capacitor $C_T$ 210 and the stack capacitor $C_s$ 215 will be much larger than the stray capacitance between the first layer of polysilicon poly1 260 and second layer of polysilicon poly2 265 with an insulating layer as described above for the capacitor insulating material 350. Thus the stray capacitance between the trench capacitor $C_T$ 210 and the stack capacitor $C_s$ 215 will have no adverse effect.

The $N^+$ source 310 is connected to the bit line BLa 230 and the $N^+$ source 320 is connected to the bit line BLb 235.

The first plate of the stack capacitor $C_s$ 215 is formed by depositing the polysilicon material poly2 265 above the capacitor insulating layer 350. A second capacitor dielectric ONO2 340 is placed over the polysilicon material poly2 265. Depositing a third polysilicon material poly3 345 on the surface of the capacitor dielectric ONO2 340 forms the second plate. The third polysilicon material poly3 345 will be extended to connect to second biasing voltage source $V_{b2}$ 245.

Although not shown, the deep N-well 10 and shallow p-well 15 of FIGS. 1a and 1d could be optionally incorporated in the twin bit DRAM cell.

Figure 4:
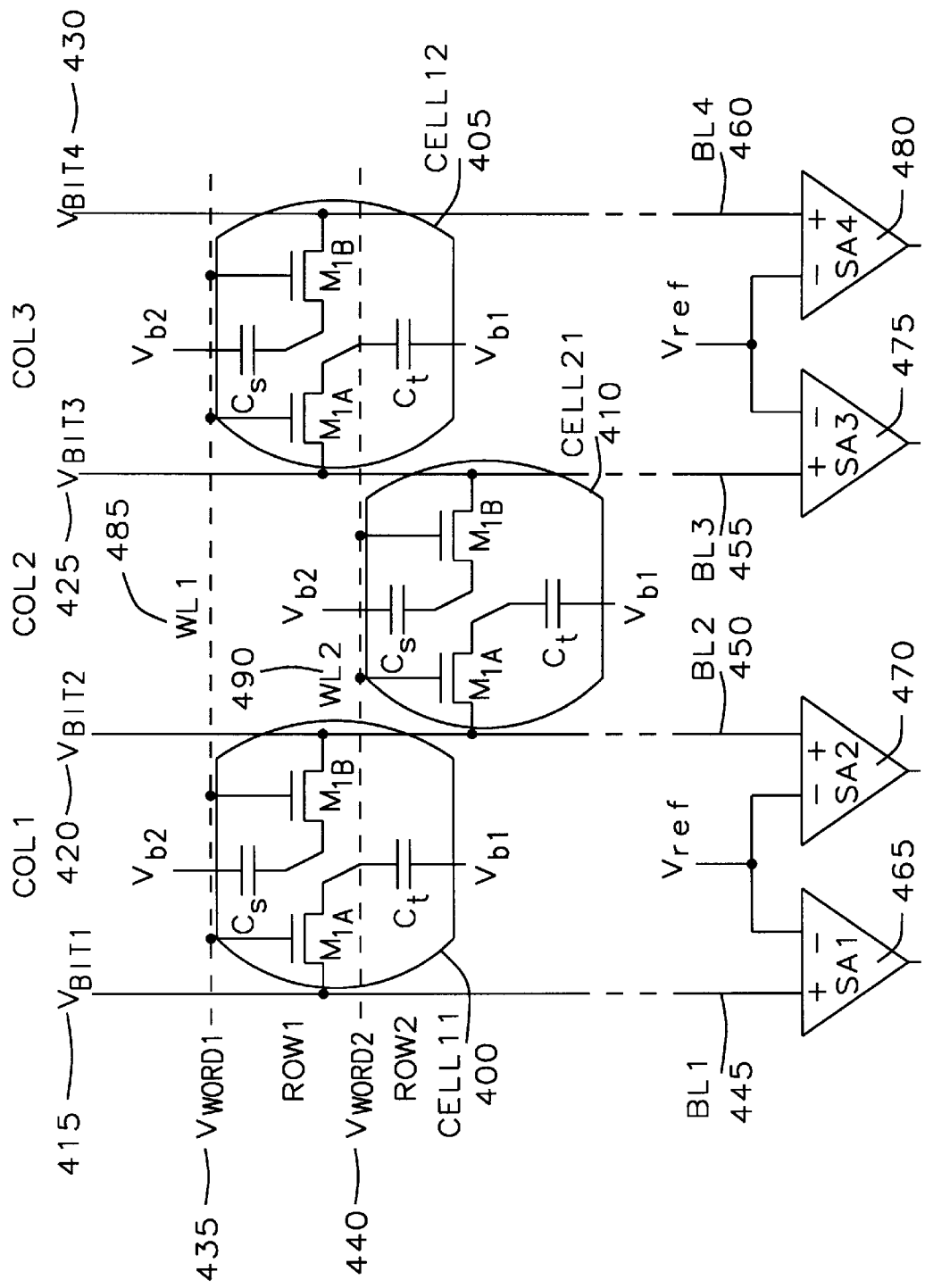
FIG. 4 shows a partial schematic of an array of twin bit DRAM cells of this invention configured for twin bit read operation.

FIG. 4 illustrates a partial array of twin bit DRAM cells organized to provide a twin bit read operation. The twin bit DRAM cells Cell11 400, Cell12 405 and Cell21 410 are arranged in rows Row1 and Row2 and columns Col1, Col2, and Col3. Each row Row1 or Row2 of the twin bit DRAM cells Cell11 400, Cell12 405 and Cell21 410 have the gates of the n-MOS transistors $M_{1a}$ and $M_{1b}$ connected to the word line of each row. For instance, the twin bit DRAM cells Cell11 400 and Cell12 405 or the first row Row1 have the gates of the n-MOS transistors $M_{1a}$ and $M_{1b}$ connected to the first word line WL1 485. The first word line WL1 485 will be connected to the word line voltage generator $V_{word1}$ 435. The word line voltage generator $V_{word1}$ 435 will selectively activate and deactivate the n-MOS transistors $M_{1a}$ and $M_{1b}$ of the twin bit DRAM cells Cell11 400, and Cell12 405 of the first row Row1. Likewise, the gates of the n-MOS transistors $M_{1a}$ and $M_{1b}$ of the twin bit DRAM cells Cell21 410 on the second row Row2 will be connected to the second word line WL2 490. The second word line WL2 490 will then be connected to the second word line voltage generator $V_{word2}$ 440.

The bit lines BL1 445, BL2 450, BL3 455, and BL4 460 will be placed at the boundaries of each of the columns Col1, Col2, and Col3. The sources of the n-MOS transistors $M_{1a}$ and $M_{1b}$ will be connected to the individual bit lines at the opposite sides of the columns Col1, Col2, and Col3. An example is the twin bit DRAM cell Cell11 400 is on the first column Col1. The source of the n-MOS transistor $M_{1a}$ of the twin bit DRAM cell Cell11 400 is connected to the bit line BL1 445, while the source of the n-MOS transistor $M_{1b}$ of the twin bit DRAM cell Cell11 400 is connected to the bit line BL2 450. The twin bit DRAM cell Cell21 410 will have the source of the n-MOS transistor $M_{1a}$ connected to the bit line BL2 450 and the source of the n-MOS transistor $M_{1b}$ is connected to the bit line BL3 455. And, likewise, the n-MOS transistors $M_{1a}$ and $M_{1b}$ of the twin bit DRAM cell Cell12 405 will be connected respectively to the bit lines BL3 455 and BL4 460.

The bit line voltage generators $V_{BIT1}$ 415, $V_{BIT2}$ 420, $V_{BIT3}$ 425, and $V_{BIT4}$ 430 will respectively be connected to the bit lines BL1 445, BL2 450, BL3 455, and BL4 460 provide the correct voltages to the bit lines BL1 445, BL2 450, BL3 455, and BL4 460 to control the flow of charges to write and read the twin bit DRAM cells Cell11 400, Cell12 405 and Cell21 410.

The sense amplifiers SA1 465, SA2 470, SA1 475, and SA1 480 will be connected to the bit lines BL1 445, BL2 450, BL3 455, and BL4 460 to sense the flow of charge from a selected cell to determine the level of charge present on the trench capacitor $C_T$ and the stack capacitor $C_s$ of the selected cell during a read operation.

For example, if the twin bit DRAM cell Cell21 410 is to be read, word line voltage generator $V_{word2}$ 440 will be set to the voltage $V_h$ that is boosted to a level greater than the power supply voltage source ($V_{cc}$). This level of voltage at the gates of the n-MOS transistors $M_{1a}$ and $M_{1b}$ will activate the n-MOS transistors $M_{1a}$ and $M_{1b}$. At this time the bit line voltage generators $V_{BIT2}$ 420 and $V_{BIT3}$ 425 will have precharged the bit lines BL2 450 and BL3 455 respectively to the voltage level that is one half the level of the power supply voltage source ($V_{cc}/2$). The charge that is present on the trench capacitor $C_T$ of Cell21 410 will flow to the sense amplifier SA2 470 and the charge present on the stack capacitor $C_s$ of Cell21 410 will flow to the sense amplifier SA3 475. Each sense amplifier will create the twin bit digital data represented by the charge present on the trench capacitor $C_T$ and the stack capacitor $C_s$ of Cell21 410.

Figure 5:
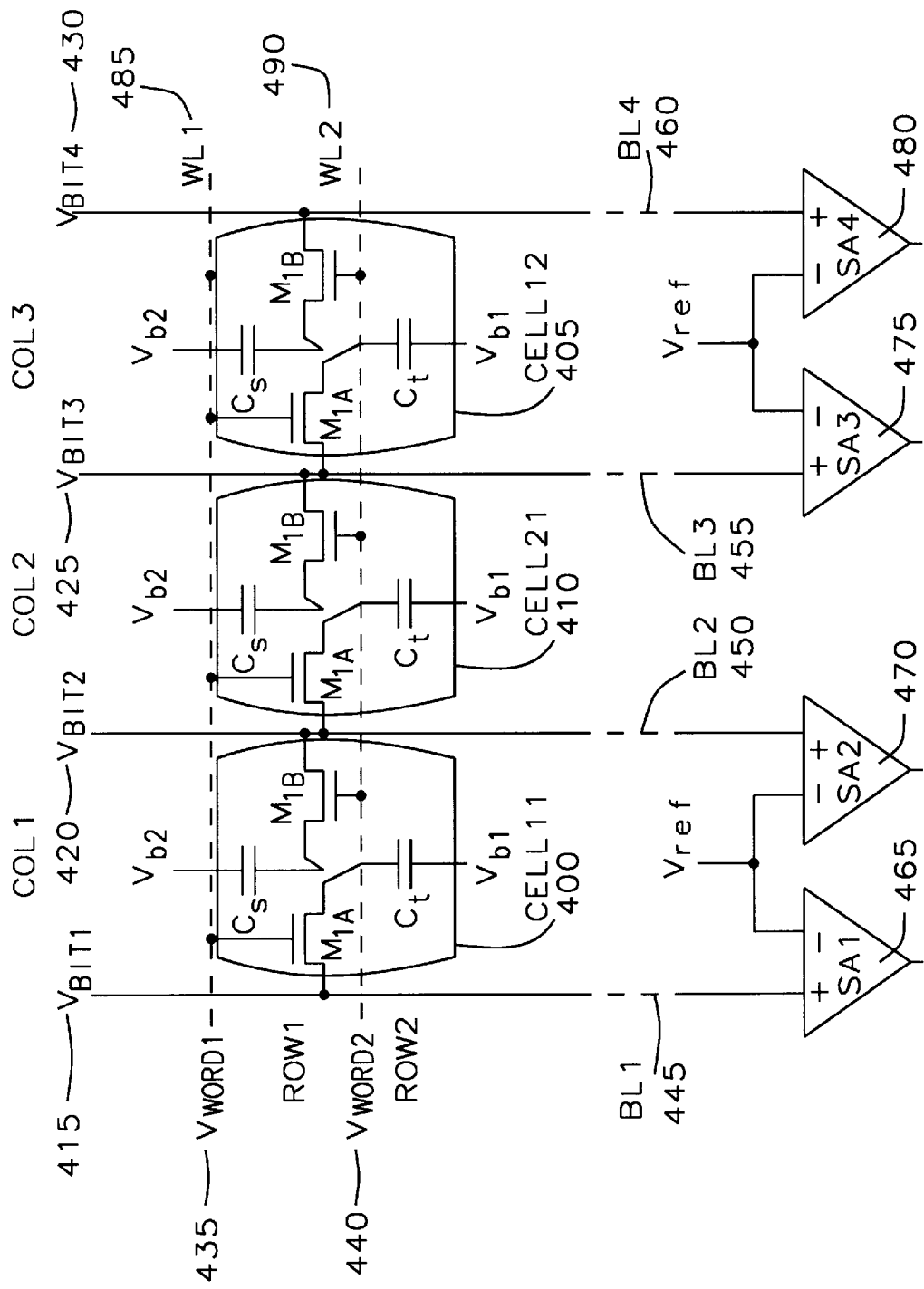
FIG. 5 shows a partial schematic of an array of twin bit DRAM cells of this invention configured for single bit read operation configured with differential sense amplifiers.

FIG. 5 illustrates a partial array of twin bit DRAM cells organized to provide a single bit read operation. The twin bit DRAM cells Cell11 400, Cell12 405 and Cell21 410 are arranged in rows and columns Col1, Col2, and Col3. Each row of the twin bit DRAM cells Cell11 400, Cell12 405 and Cell21 410 have the gates of the n-MOS transistors $M_{1a}$ connected to the first word line $WL_1$ 485 of the row and the gates of the n-MOS transistors $M_{1b}$ connected to the second word line $WL_2$ 490 of the row. The first word line WL1 485 will be connected to the word line voltage generator $V_{word1}$ 435. The word line voltage generator $V_{word1}$ 435 will selectively activate and deactivate the n-MOS transistors $M_{1a}$ of the twin bit DRAM cells Cell11 400, Cell12 405 and Cell21 410. Likewise, the second word line WL2 490 will then be connected to the second word line voltage generator $V_{word2}$ 440. The word line voltage generator $V_{word2}$ 440 will selectively activate and deactivate the n-MOS transistors $M_{1b}$ of the twin bit DRAM cells Cell11 400, Cell12 405 and Cell21 410. This configuration will allow the individual bits of the twin bit DRAMS cells Cell11 400, Cell12 405 and Cell21 410 to be written or read by selectively activating the appropriate first word line voltage generator $V_{word1}$ 435 or the second word line voltage generator $V_{word2}$ 440.

The bit lines BL1 445, BL2 450, BL3 455, and BL4 460 will be placed at the boundaries of each of the columns Col1, Col2, and Col3. The sources of the n-MOS transistors $M_{1a}$ and $M_{1b}$ will be connected to the individual bit lines at the opposite sides of the columns Col1, Col2, and Col3. An example is the twin bit DRAM cell Cell11 400 is on the first column Col1. The source of the n-MOS transistor $M_{1a}$ of the twin bit DRAM cell Cell11 400 is connected to the bit line BL1 445, while the source of the n-MOS transistor $M_{1b}$ of the twin bit DRAM cell Cell11 400 is connected to the bit line BL2 450. The twin bit DRAM cell Cell21 410 will have the source of the n-MOS transistor $M_{1a}$ connected to the bit line BL2 450 and the source of the n-MOS transistor $M_{1b}$ is connected to the bit line BL3 455. And, likewise, the n-MOS transistors $M_{1a}$ and $M_{1b}$ of the twin bit DRAM cell Cell12 405 will be connected respectively to the bit lines BL3 455 and BL4 460.

The bit line voltage generators $V_{BIT1}$ 415, $V_{BIT2}$ 420, $V_{BIT3}$ 425, and $V_{BIT4}$ 430 will respectively be connected to the bit lines BL1 445, BL2 450, BL3 455, and BL4 460 provide the correct voltages to the bit lines BL1 445, BL2 450, BL3 455, and BL4 460 to control the flow of charges to write and read the twin bit DRAM cells Cell11 400, Cell12 405, and Cell21 410.

The sense amplifiers SA1 465, SA2 470, SA1 475, and SA1 480 will be connected to the bit lines BL1 445, BL2 450, BL3 455, and BL4 460 to sense the flow of charge from a selected cell to determine the level of charge present on the trench capacitor $C_T$ and the stack capacitor $C_s$ of the selected cell during a read operation.

Figure 6:
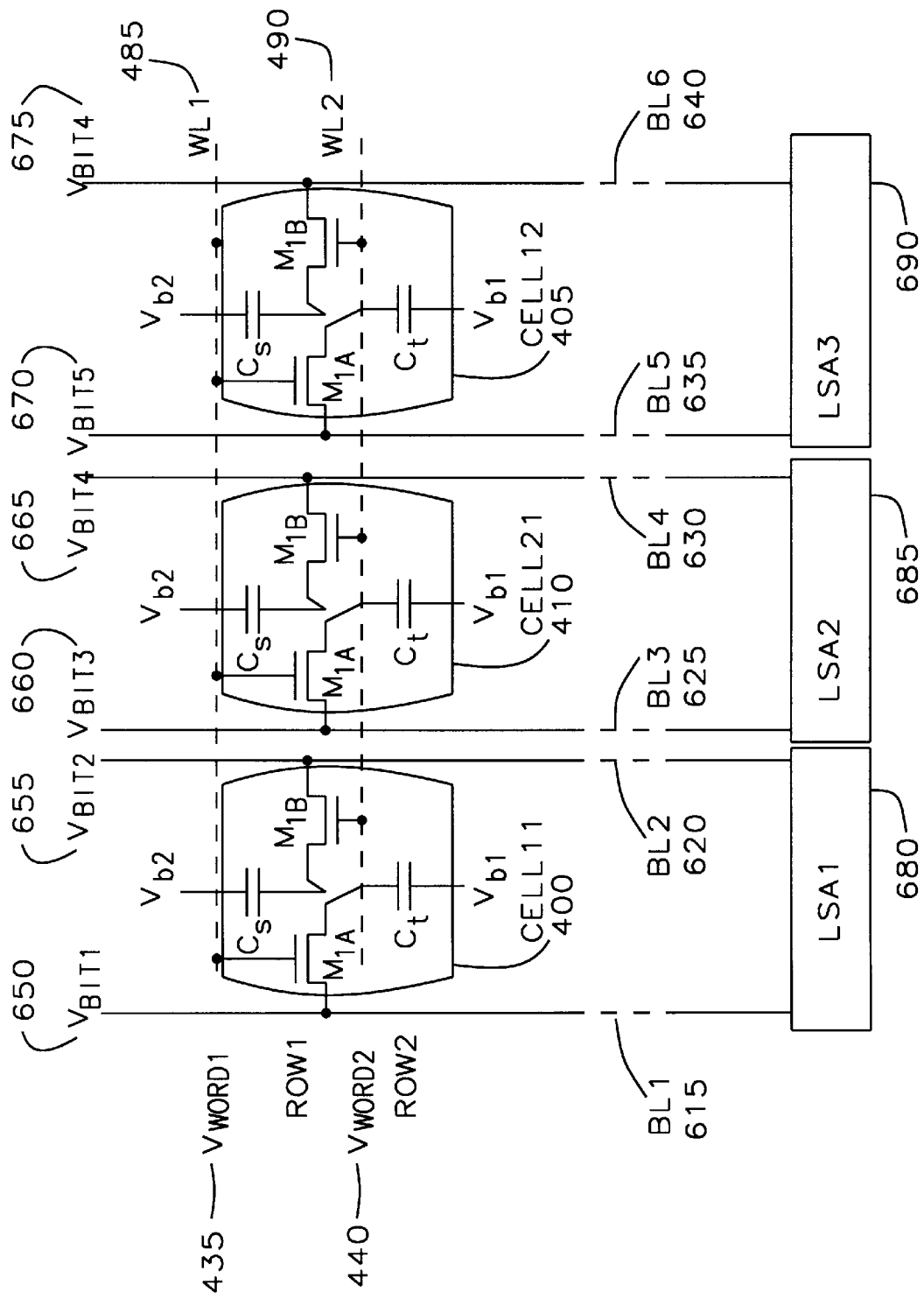
FIG. 6 shows a partial schematic of an array of twin bit DRAM cells of this invention configured for single bit read operations with latched type sense amplifiers.

FIG. 6 illustrates a partial array of twin bit DRAM cells organized to provide a single bit read operation using a latched-type sense amplifier. The twin bit DRAM cells Cell11 400, Cell12 405 and Cell21 410 are arranged in rows and columns Col1, Col2, and Col3. Each row of the twin bit DRAM cells Cell11 400, Cell12 405 and Cell21 410 have the gates of the n-MOS transistors $M_{1a}$ connected to the first word line $WL_1$ 485 of the row and the gates of the n-MOS transistors $M_{1b}$ connected to the second word line $WL_2$ 490 of the row. The first word line WL1 485 will be connected to the word line voltage generator $V_{word1}$ 435. The word line voltage generator $V_{word1}$ 435 will selectively activate and deactivate the n-MOS transistors $M_{1a}$ of the twin bit DRAM cells Cell11 400, Cell12 405 and Cell21 410. Likewise, the second word line WL2 490 will then be connected to the second word line voltage generator $V_{word2}$ 440. The word line voltage generator $V_{word2}$ 440 will selectively activate and deactivate the n-MOS transistors $M_{1b}$ of the twin bit DRAM cells Cell11 400, Cell12 405 and Cell21 410. This configuration will allow the individual bits of the twin bit DRAMS cells Cell11 400, Cell12 405 and Cell21 410 to be written or read by selectively activating the appropriate first word line voltage generator $V_{word1}$ 435 or the second word line voltage generator $V_{word2}$ 440.

The bit lines BL1 615, BL2 620, BL3 625, BL4 630, BL5 635, and BL6 640, will be placed at the boundaries of each of the columns Col1, Col2, and Col3. The sources of the n-MOS transistors $M_{1a}$ and $M_{1b}$ will be connected to the individual bit lines at the opposite sides of the columns Col1, Col2, and Col3. An example is the twin bit DRAM cell Cell11 400 is on the first column Col1. The source of the n-MOS transistor $M_{1a}$ of the twin bit DRAM cell Cell11 400 is connected to the bit line BL1 615, while the source of the n-MOS transistor $M_{1b}$ of the twin bit DRAM cell Cell11 400 is connected to the bit line BL2 620. The twin bit DRAM cell Cell21 410 will have the source of the n-MOS transistor $M_{1a}$ connected to the bit line BL3 625 and the source of the n-MOS transistor $M_{1b}$ is connected to the bit line BL4 630. And, likewise, the n-MOS transistors $M_{1a}$ and $M_{1b}$ of the twin bit DRAM cell Cell12 405 will be connected respectively to the bit lines BLS 635 and BL4 640.

The bit line voltage generators $V_{BIT1}$ 650, $V_{BIT2}$ 655, $V_{BIT3}$ 660, $V_{BIT4}$ 665, $V_{BIT5}$ 670, and $V_{BIT6}$ 675 will respectively be connected to the bit lines BL1 615, BL2 620, BL3 625, BL4 630, BL5 635, and BL6 640 provide the correct voltages to the bit lines BL1 615, BL2 620, BL3 625, BL4 630, BL5 635, and BL6 640 to control the flow of charges to write and read the twin bit DRAM cells Cell11 400, Cell12 405, and Cell21 410.

The latched type sense amplifiers LSA1 680, LSA2 685, and LSA3 690 will be connected to the bit BL1 615, BL2 620, BL3 625, BL4 630, BL5 635, and BL6 640 to sense the flow of charge from a selected cell to determine the level of charge present on the trench capacitor $C_T$ and the stack capacitor $C_s$ of the selected cell during a read operation.

It will be noticed that the trench capacitors $C_T$ for each twin bit DRAM cell Cell11 400, Cell12 405 and Cell21 410 and the stack capacitors $C_s$ for each twin bit DRAM cells Cell11 400, Cell12 405 and Cell21 410 are respectively connected to common word lines. That is the trench capacitors $C_T$ for each twin bit DRAM cell Cell11 400, Cell12 405 and Cell21 410 are connected to first word line $WL_1$ 485 of the row and the stack capacitors $C_s$ for each twin bit DRAM cells Cell11 400, Cell12 405 and Cell21 410 are connected to the second word line $WL_2$ 490 of the row.

Figure 7:
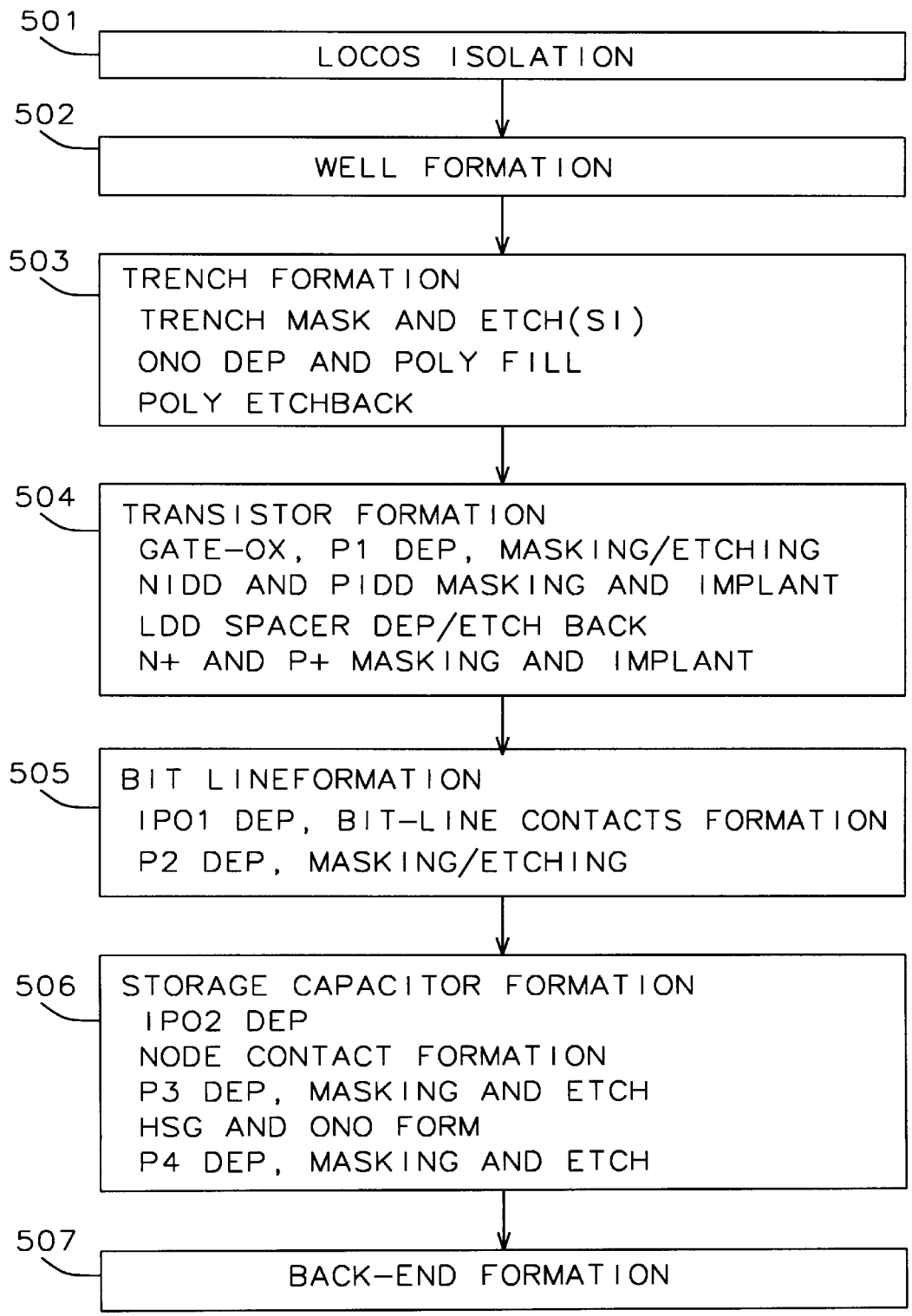
FIG. 7 is a process flow diagram of the fabrication of twin bit DRAM cells on a semiconductor substrate of this invention.

Refer now to FIG. 7. The process of fabricating a twin bit DRAM cell on a semiconductor substrate begins by the definition of the area of the twin bit DRAM cell by the formation of the LOCOS isolation 501 on the surface of the semiconductor substrate. The areas within the LOCOS isolation are then optionally masked and implanted 502 to form the deep N-well and the shallower P-well.

The trench capacitor is then formed 503 by first masking and deep etching to a depth of approximately 7 μm from the surface of the semiconductor substrate to form the trenches. The trenches are coated with a thin insulating material such as silicon dioxide to a thickness of approximately 50 Å, silicon nitride to a thickness of approximately 100 Å, or oxidized silicon nitride ONO to a thickness of approximately 120 Å. The trenches are then filled with a first polysilicon material to form the top plate of the trench capacitor. The first polysilicon material is then etched back such that it is level with the surface of the semiconductor substrate.

The pass transistors and transistors for the peripheral circuitry are formed 504 by first masking areas that are to define the channel regions of the transistors. A second insulating material is then grown in the channel regions to form a gate oxide that has a thickness of approximately 80 Å. A gate polysilicon material will be deposited and etched back on the gate oxide to form the gates of the transistors. The gates of the pass transistors will be connected as above described to the word lines. The source and drain regions will be masked and implanted with P-type or N-type material to form lightly doped drain area PLDD/NLDD. LDD spacers are then deposited adjacent to the gates of the transistors. The source and drain regions are masked and implanted again with P-type or N-type material to complete the formation of the drains and sources of the transistors.

The bit lines are then formed 505 by first depositing a third insulating material IPO1. The third insulating material IPO1 will be a thick insulating material such as silicon dioxide deposited to a thickness of 75,000 ÅA. Bit line contacts are then formed to the contacts of the sources of the pass transistors. Additionally, contacts will be formed to contact the drains of the pass transistors and the top plate of the trench capacitor.

The stack capacitor is formed 506 by first depositing a fourth insulating material IPO2 such that it will be in contact with the drain of another of the pass transistors. The fourth insulating material IPO2 is a thick insulating material such as silicon dioxide deposited to a thickness of approximately 5000 Å. Contacts are formed to the interconnecting block. A third polysilicon material P3 is deposited, masked, and etched to form the first plate of the stack capacitor. A fifth insulating material is deposited on the first plate of the stack capacitor to form the dielectric for the stack capacitor. The fifth insulating material is a thin insulating material such as silicon dioxide deposited to a thickness of approximately 50 Å, silicon nitride deposited to a thickness of approximately 100 Å, or oxidized silicon nitride ONO deposited to a thickness of approximately 120 Å.

A fourth polysilicon material P4 is deposited, masked, and etched to form the second plate of the stack capacitor. The fourth polysilicon material P4 will be extended to contact the second biasing voltage source $V_{b2}$.

The back-end formation 507 will provide the contacts and metalization necessary to interconnect the peripheral circuits and the circuitry of the twin bit DRAM array.

While this invention has been particularly shown and described with is reference to the preferred embodiments thereof, it will be understood by those skilled in the art that various changes in form and details may be made without departing from the spirit and scope of the invention.

The invention claimed is:

1. A method of fabrication of a plurality of twin bit DRAM cells whereby each twin bit DRAM cell has a first pass transistor, a trench capacitor coupled to the first pass transistor, a second pass transistor, and a stack capacitor coupled to the second pass transistor so as to retain two bits of digital data, wherein said method comprises the steps of:

a) providing a semiconductor substrate having a surface implanted with a material of a first conductivity type;

d) creating the first and second pass transistors in the semiconductor substrate by:
creating the source and drain by implanting a material of the second conductivity type into said semiconductor substrate at a channel distance apart,
growing a gate oxide on the surface of said semiconductor substrate in the area between the source and the drain, and
creating the gates of said first and second pass transistors by depositing a first polysilicon material above the gate oxide;

e) forming the trench capacitor in the semiconductor substrate by:
etching a trench into the surface of the semiconductor substrate such that the semiconductor substrate is the bottom plate of said trench capacitor,
depositing a trench dielectric on an inner surface of said trench, and
filling said trench with a second polysilicon material to form the top plate of said trench capacitor, f) connecting the drain for said first pass transistor to the top plate of said trench capacitor;

g) forming an insulating layer by depositing a first insulating material on the surface of the semiconductor substrate;

h) forming the stack capacitor by:
depositing a third polysilicon layer upon said insulating layer to form a first plate;
depositing a second insulating material upon said first plate to form a capacitor dielectric for said stack capacitor; and
depositing a fourth polysilicon layer upon said capacitor dielectric to form a second plate; and i) connecting the drain of the second pass transistor to the first plate with an interconnecting block formed during the depositing of the third polysilicon layer;

j) connecting said bottom plate of said trench capacitor to a first biasing voltage source; and k) connecting said second plate of said stacked capacitor to a second biasing voltage source.

2. The method of claim 1 wherein the gates of the first and second pass transistors are each connected to a word line voltage generator to activate and deactivate said pass transistor.

3. The method of claim 2 wherein the sources of the first and second pass transistor is each connected respectively to a first and second bit line voltage generator to establish a necessary bit line voltage level during a writing and reading of said twin bit DRAM cells.

4. The method of claim 3 wherein the two bits of digital data are simultaneously written to said twin bit DRAM cell by activating said word line voltage generator to a voltage that is greater than a level of a power supply voltage source, and placing the two bits of digital data at the first and second bit line voltage generators to charge the trench capacitor and the stack capacitor to appropriate levels representing the two bits of digital data.

5. The method of claim 3 wherein a first sense amplifier is connected to said first bit line to sense a level of charge representing the one of the two bits of digital data retained on said trench capacitor and a second sense amplifier is connected to said second bit line to sense a level of charge representing the other of the two bits of digital data retained on said stack capacitor within said twin bit DRAM cell.

6. The method of claim 5 wherein said twin bit DRAM cell is read by activating said word voltage generator to a voltage that is greater than a level of a power supply voltage source to activate said pass transistor, the first and second bit line voltage generators will be set to a level approximately on half the power supply voltage source to precharge said bit line, and the first and second sense amplifiers sensing the level of charge present on said trench capacitor and said stack capacitor.

7. The method of claim 1 further comprising creating a deep well by implanting the material of the second conductivity type into said surface of said semiconductor substrate.

8. The method of claim 7 further comprising creating a shallow well by implanting the material of the first conductivity type into said deep well.

* * * * *